United States Patent [19]

Elder et al.

[11] Patent Number: 5,225,037
[45] Date of Patent: Jul. 6, 1993

[54] METHOD FOR FABRICATION OF PROBE CARD FOR TESTING OF SEMICONDUCTOR DEVICES

[75] Inventors: Richard A. Elder; Arthur M. Wilson; Susan V. Bagen, all of Dallas; Juanita G. Miller, Richardson, all of Tex.

[73] Assignee: Texas Instruments Incorporated, Dallas, Tex.

[21] Appl. No.: 709,954

[22] Filed: Jun. 4, 1991

[51] Int. Cl.$^5$ .......................... B44C 1/22; C23F 1/00
[52] U.S. Cl. .................... 156/644; 156/656; 156/659.1; 156/902; 156/668; 324/158 F; 324/158 P; 437/220; 439/68
[58] Field of Search ............ 156/634, 644, 656, 659.1, 156/665, 668, 901, 902; 324/158 F, 158 P; 357/70; 437/220; 29/827; 361/421; 439/68

[56] References Cited

U.S. PATENT DOCUMENTS 5,066,357 11/1991 Smyth et al. .................. 156/902 X Primary Examiner—William A. Powell
Attorney, Agent, or Firm—Gary C. Honeycutt; Richard L. Donaldson; William E. Hiller

[57] ABSTRACT

A flexible polyimide film is used to support an array of precisely located contact bumps which are used to probe die on a wafer of semiconductor circuits, or an unmounted integrated circuit die, several integrated circuits, or hybrid devices. By utilizing a standard I/O contact pattern for the flexible film and fabricating the membrane assembly of interconnects on an aluminum substrate, it is possible to produce a more reliable probe card, while reducing the fabrication time and costs for the probe card. The polyimide film must be selected to have a CTE of 3 to 5, which is only about 1/5 to 1/7 as great as the CTE of the aluminum substrate on which the film is formed. This produces a critical degree of compressive stress in the polyimide film, and a resulting "bow" of the film when the central area of the aluminum is etched away.

10 Claims, 7 Drawing Sheets

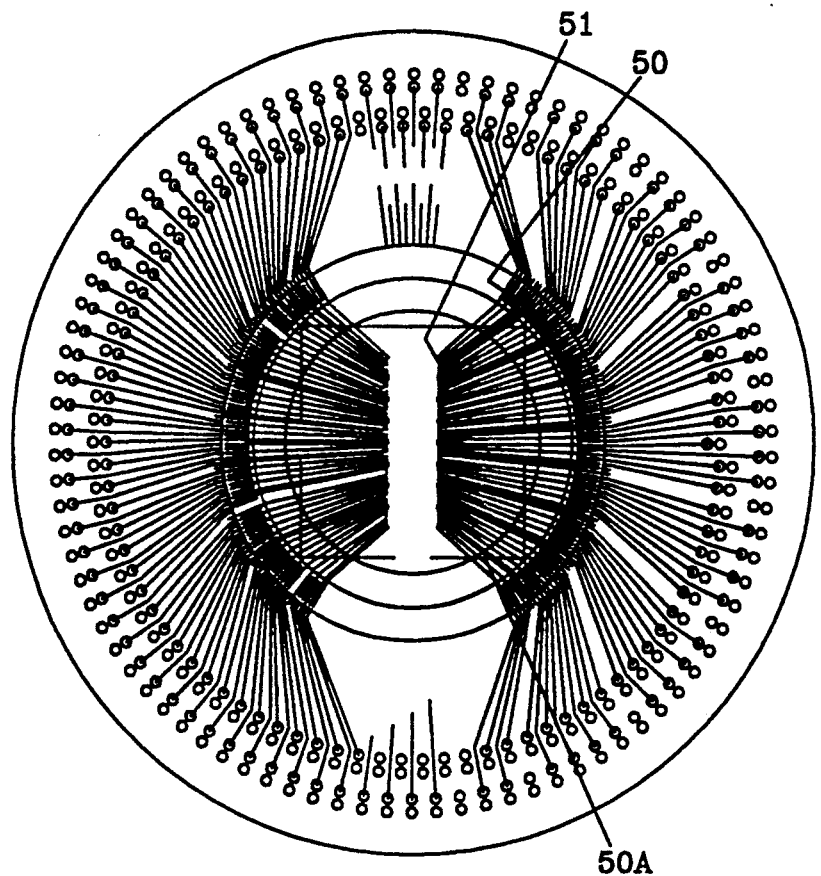
FIGURE 9
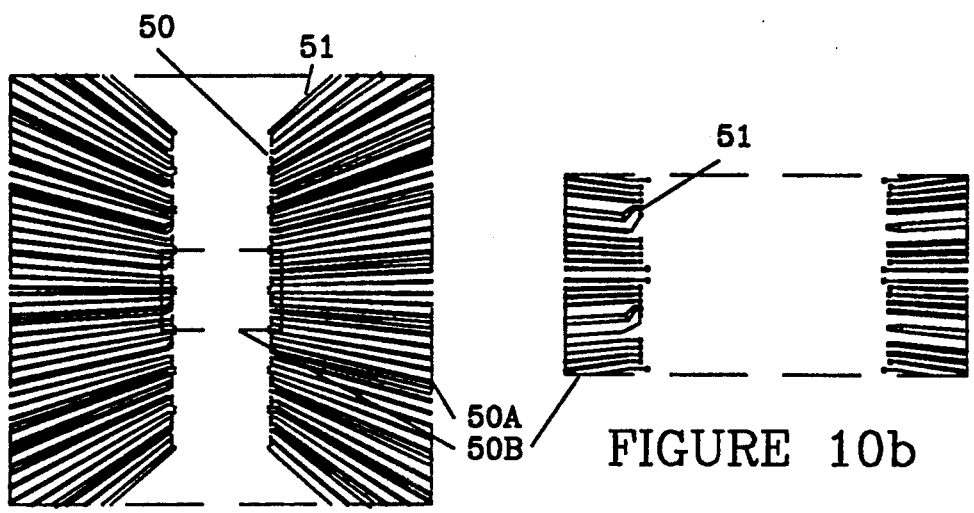
FIGURE 10a
FIGURE 10b

METHOD FOR FABRICATION OF PROBE CARD FOR TESTING OF SEMICONDUCTOR DEVICES

FIELD OF THE INVENTION

This invention relates to semiconductor devices, and more particularly to a flexible membrane probe card for electrical testing of semiconductor devices, hybrids and interconnections.

CROSS REFERENCED INVENTION

This invention uses technology similar, in part, to copending patent application Ser. No. 505,743, filed Apr. 6, 1990, now abandoned, entitled NON-DESTRUCTIVE BURN-IN TEST SOCKET FOR INTEGRATED CIRCUIT DIE and co-pending patent application Ser. No. 505,810 filed Apr. 6, 1990, now abandoned, entitled PROBE CARD FOR TESTING OF SEMICONDUCTOR DEVICES.

BACKGROUND OF THE INVENTION

Integrated circuits, hybrid devices and packaging interconnects are all increasing in size and complexity. Large area devices and substrates with high I/O pin counts are becoming more common. One problem with large devices is that it is becoming more difficult to electrically test the circuits. As the density and number of I/O on a circuit increase, conventional probe cards become more difficult to construct and maintain. For large ASIC devices, the number of I/O pads may exceed the maximum density of probes which can be accommodated on a conventional probe card. With some applications, such as probing hybrid substrates or packaging interconnects, an area array of probe locations would be desirable, but impossible to test with current technology. In addition to these problems of probe card complexity, the cost of a probe card increases dramatically as the probe count increases.

Standard electrical probing methods for semiconductor devices utilize needle or "blade" probe cards to provide electrical contact between the test system and the device. Tungsten needles are soldered onto an epoxy board around the perimeter of a hole cut in the probe card. The fabrication of these probe cards is more of an art than a manufacturing technique in that each probe point must be individually soldered to the card, and carefully aligned to a test pad on the device. The planarity and relative position of the needle tips are critical to successful probing of a device. During use, each contact of the probe tips to the test pads causes the needles to be slightly deformed, eventually resulting in the probe card needing repair. This labor intensive method of making and maintaining probe cards causes the price of the card to be high, increasing in cost as the number of probe tips increase.

More recently, membrane probe cards have been proposed, such as those appearing in U.S. Pat. Nos. 4,758,785; 4,891,585; 4,906,920; and 4,918,383. However, these proposals have not found widespread acceptance, due to lack of reliable contact with the chip pads, and excessive cost.

SUMMARY OF THE INVENTION

The invention is a probe card for testing semiconductor devices and the methods of constructing the probe card, and the technique of using the probe card in testing devices. In fabricating the probe membrane, a polished aluminum wafer is coated with a selected polyimide resin film having a much smaller CTE (Coefficient of Thermal Expansion) than the aluminum wafer. Signal lines are formed on the cured polymer through thin film evaporation or sputtering methods and photolithographic and plating techniques. Additional layers of polymer and metal lines may be added to the structure for signal routing purposes. Contact pads are formed on the periphery of the membrane which connect to the signal lines in the membrane. In the center of the membrane, contact bumps are formed in a similar manner which correspond to the locations of the test points on the semiconductor device. The contact bumps are electrically connected to the peripheral pads on the membrane through the internal signal leads. Once the structure is complete, the back of the aluminum wafer is patterned and etched, leaving the flexible probe membrane firmly attached at its periphery to a thin ring of metal. Because of the large difference between the CTE of aluminum and that of the selected polyimide, there is a critical degree of "bowing" of the membrane, away from the original plane of the aluminum wafer. This bowing makes possible the improved performance and reduced cost of the invention. Although the highest difference in CTE is obtained with aluminum, other high CTE metals may be used, such as copper, and are included as part of this invention.

The membrane is attached to a printed wire board which is configured to fit an electrical test system and a wafer prober, i.e. a device to control the X, Y and Z positions of the Device Under Test (DUT) in alignment to the probe card. The peripheral pads on the membrane are electrically connected to contacts on the printed wired board. A quartz plate or other rigid member is attached to the back of the membrane directly behind the probe contacts to ensure that the contacts remain planar. The cavity behind the membrane is then filled with an elastomer and a rigid backing plate is placed on the back of the probe card to provide support to the membrane and elastomer.

The probe card made using the method of the invention uses a flexible film to support an array of precisely located contact bumps which are used to probe a circuit. By utilizing a standard I/O footprint for the flexible film, and fabricating the interconnect on a metal substrate, it is possible to greatly reduce the cost of the probe card while reducing the fabrication time for the cards. The flexible film with bumps essentially replaces the metal needles which are used in conventional cards. With the present invention, very high probe densities can be obtained at low cost, with higher reliability and reduced maintenance requirements. High speed signal lines may be designed into the membrane providing impedance matching from the I/O on the test probe card, to the bumps contacting the device under test.

An aluminum wafer is used as a starting substrate. Alternating layers of a selected polymide film and metal signal lines are sequentially patterned to produce the final interconnect film. Metal bumps such as tungsten coated copper, or gold are used as the probe tips for low contact resistance. By utilizing a standard I/O footprint on the metal substrate, a number of different probe designs can be accommodated on a single test system. When a new design needs to be tested, the probe card can be replaced with a similar probe card which has a different interconnect attached to the surface of the printed wire board.

Ultrasonic energy can be applied to the probe bumps on the interconnect through a transducer mounted on the probe card. The ultrasonic motion will break through any contamination on the test pads insuring good electrical contact. Multiple contacts of the probe bumps on the test pads will also break through contamination which may be present on the pads.

Using the probe card of the invention, high density packaging interconnects and hybrid substrates can be probed prior to attaching components to their surface. Large ASIC devices can be tested as well as high speed Gallium Arsenide chips. Multiple die can be probed simultaneously. Passive as well as active devices may be tested. Large numbers of identical probe cards may be manufactured at a relatively low unit cost.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 9 illustrates a probe card for testing multiple die on a semiconductor wafer;

FIGS. 10a and 10b are close-up views of bump patterns on FIG. 9; and

DESCRIPTION OF A PREFERRED EMBODIMENT

Figure 1:
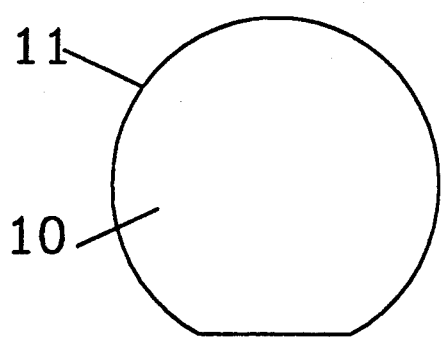
FIGS 1(a-g) illustrate the membrane probe head process flow.
Figure 1B:
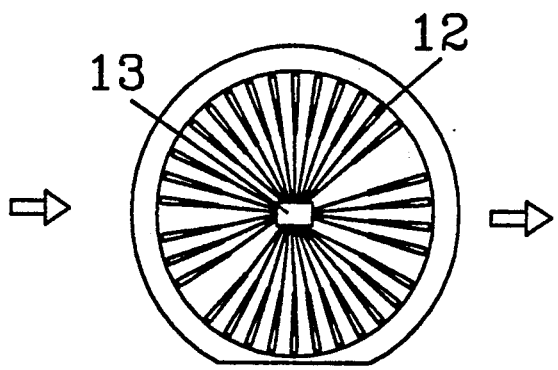
Figure 1C:
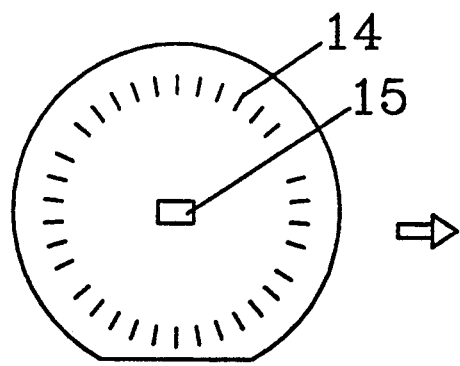
Figure 1:
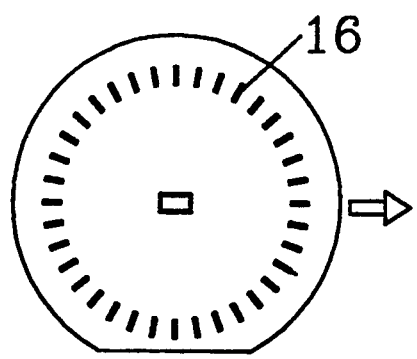
Figure 1:
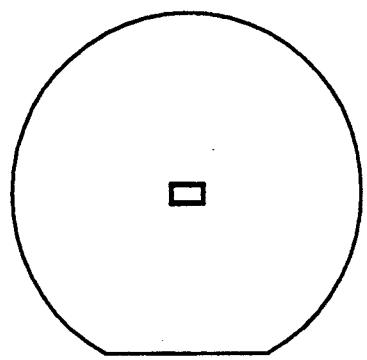
Figure 1:
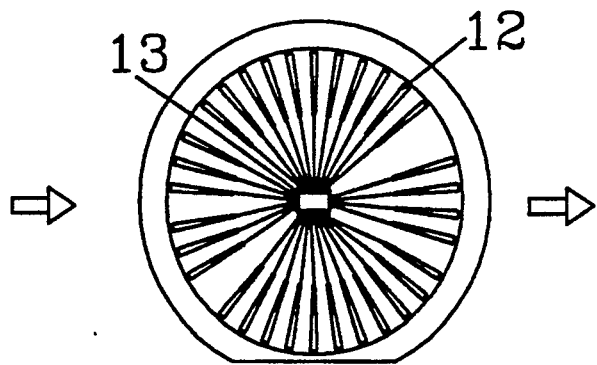
Figure 1:
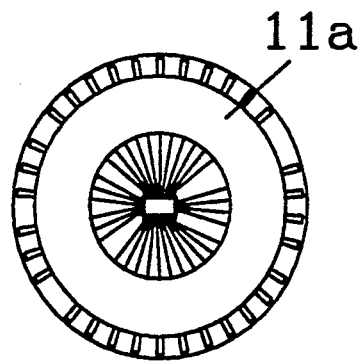

FIG. 1 illustrates the various steps in fabricating a thin ffilm probe card of the present invention. An aluminum wafer 11, having a thickness of 20 to 30 mils, for example, with a surface finish of less than 1 micron is machined into a shape similar to that of a silicon wafer. A layer of liquid polyamic acid resin is applied over the metal wafer and cured. The acid resin may be spun onto the wafer similar to methods used in covering semiconductor wafers with photo etching films. The curing step converts the acid resin to polyimide resin. The polyamic acid resin is selected to yield a polyimide film having a CTE of 3 to 5. This is a much smaller CTE than the aluminum, which has a CTE of about 24. A suitable polyamic acid resin is readily available commercially, such as duPont PI 2611, for example.

After wafer 11 is coated with the polyimide film 10, as illustrated in step (a), a pattern of metal signal leads 12 is plated on the polymer film, step (b). The leads 12 converge at the center of the pattern to form a pattern 13 similar to the contacts on an integrated circuit device. In step (c) a second layer of the same or similar polyimide is deposited over the pattern of signal leads 13, and openings (vias) 14 and 15 are formed in the polyimide to expose contact areas on signal leads 12 and the lead-signal ends at 13. In step (d), metal is deposited through the vias to form contact pads on top of the polyimide layer, and to form contact bumps on the ends of the signal leads at 13. The probe bumps at 13 are plated in step (e). Step (f) illustrates the completed probe. Since the polyimide is transparent, the signal leads are visible even though they are sandwiched between layers of polyimide. In step (g), wafer 11 is etched to remove all of the aluminum except the part 11a, which is used as a support for the probe head. The above series of steps is for a single sided membrane probe head.

Figure 4:
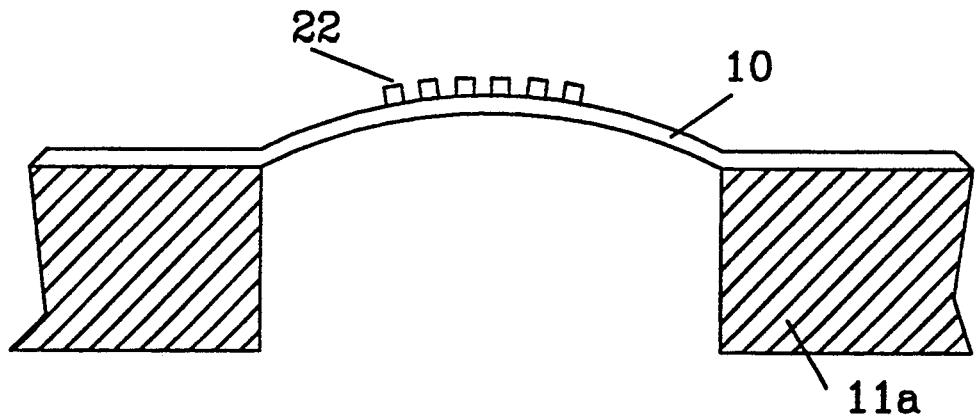
FIG. 4 illustrates bowing of polyimide after etching the metal substrate.

The difference in the thermal expansion coefficients of the polyimide and the aluminum wafer cause the film to be under compressive stress, therefore, the film will bow out when the wafer is etched away. as shown in FIG. 4. The stress in the polyimide film can vary from highly compressive to tensile, depending upon the type of polyimide and metal substrate used. Thus, an aluminum substrate and a polymide CTE between 3 and 5 are essential.

An Alternative process for constructing the probe card, known as a double sided membrane probe head, is as follows. Gold pads are patterned on the wafer 11. Polyimide is coated over the pads and contact (vias) are opened. Signal leads are formed on the polyimide layer using semiconductor processing techniques. The leads contact the gold pads on the perimeter of the wafer though the vias. A second layer of polyimide film is applied over the signal leads and openings are formed in the second layer of film to provide access to the signal leads. Contacts are plated on the second layer of film and through the openings to form interconnections to the signal lead. The ends of the signal leads in the center of the probe are connected to contact bumps. The contact bumps are plated, then the aluminum wafer is etched to leave a support ring. The resulting structure is a metal doughnut with a flexible polyimide interconnect attached to the front of the aluminum ring. When the aluminum substrate is etched into a ring, the gold probe pads are revealed, attached to the back of the membrane.

Figure 2:
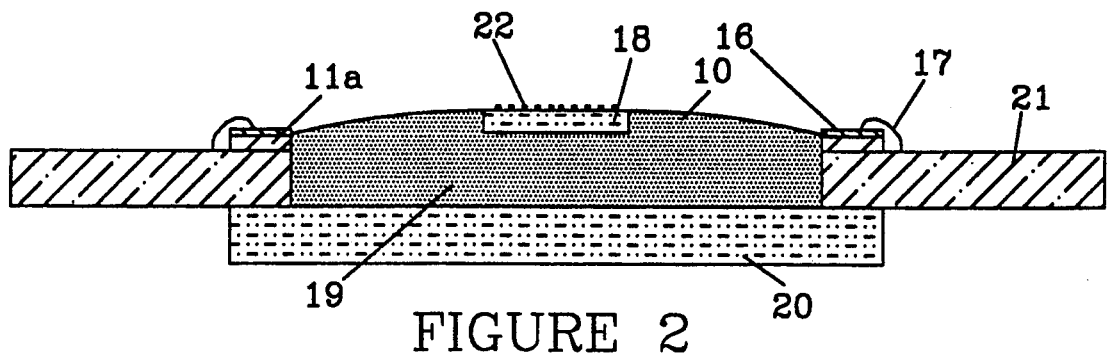
FIG. 2 is a cross sectional view of the membrane probe card.
Figure 3:
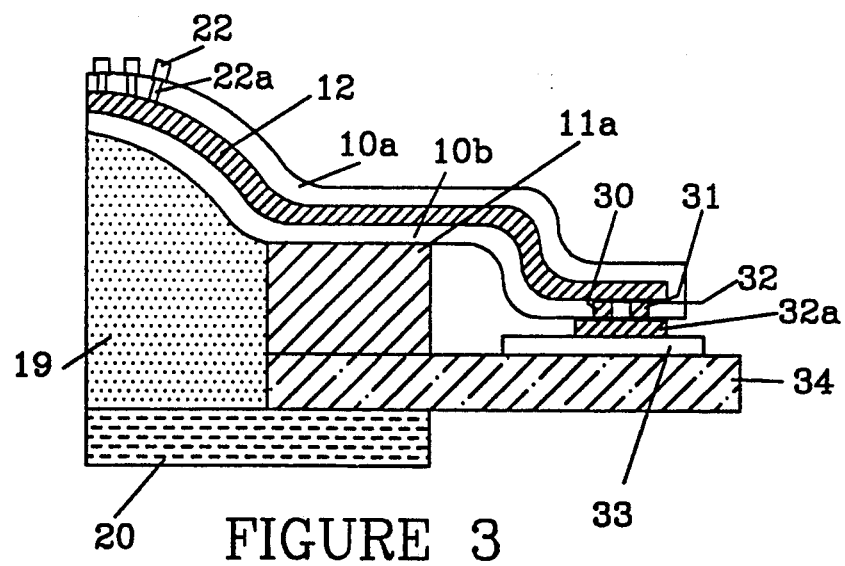
FIG. 3 is a cross sectional view of a part of the probe card showing an alternative interconnection technique between the flexible membrane and the printed wire board.

After etching the aluminum wafer, a solder paste is screen printed onto the interconnect over the gold pads 32a on the bottom of the interconnect (FIG. 3). The interconnect is then placed on probe card solder pads 33, aligned and epoxied to the card 34. Since the edge of the aluminum substrate has been etched away, alignment to the probe card is relative easy. The solder is then reflowed on the interconnect to electrically attach it to the probe card. The preferred connection is by bond wires as shown at 17 in FIG. 2. The completed probe card assembly is turned over and a a backing insert 18 is placed behind the contact bumps 22 and then a clear elastomer 19 (FIG. 2) is poured into the center cavity and cured. A flat transparent backing plate 20 is then attached to the board.

FIG. 2 is a cross-sectional view of the thin film membrane probe mounted on a printed circuit board. Membrane film 10 is attached to aluminum ring 11a. Signal leads 12 (FIG. 1) are not illustrated due to the small scale of FIG. 2, but will be illustrated in FIG. 3. The signal leads interconnect the bumps 22 with contacts 16 and bond pads 16a. Contacts 16 are connected to the circuit board 21 by bond wires 17. Circuit board 21 interfaces the probe card with test circuitry.

To maintain contact bumps in a common plane, insert plate 18 is placed behind bumps 22. To support the bumps, an elastomer fills the area within ring 11a and membrane 10, and the elastomer is enclosed in the opening by backing plate 20. While not illustrated, passive and active components may be mounted on the membrane or the printed circuit board to modify the test signals from the device under test (not illustrated but would be interconnected with bumps 22).

FIG. 3 is a cross sectional view of a part of the probe card showing interconnection through the back side of the double-sided membrane. Signal leads 12 are sandwiched between two layers of polyimide 10a and 10b. The signal leads are connected to the probe bumps 22 by the vias 22a in the outer layer 10a of the membrane 10. Signal leads extend to the edge of the membrane layer and connected to contact 33 on circuit board 34 through vias 30 and 31, gold pad and solder 32a. These vias extend through 10b and would correspond to the openings 14 illustrated in FIG. 1. The circuit board 34 interconnects the membrane probe head and signal leads to the automated test equipment/probe card interface (not illustrated).

Figure 5:
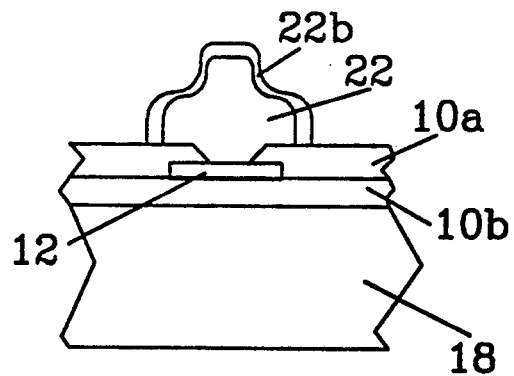
FIG. 5 illustrates probe bump construction.

FIG. 5 is a close-up view of a probe bump 22 and its interconnection with one of the signal leads 12. Signal lead 12 is sandwiched between two layers of polyimide 10a and 10b and connected to probe bump 22. The probe bumps may be plated, with copper or gold, and capped with a wear resistant material, such as tungsten or nickel. Insert 18 is shown below the polyimide layer 10b.

In testing a device, the contact bumps 22 (FIG. 2) are aligned to a device by looking through the clear elastomer. The probe card is brought into contact with the device under test and pressure is applied to slightly deform the interconnect until all the probe bumps are touching test pads on the device. The flexible film and compliant elastomer will allow all of the testing bumps to contact the device test pads without damaging the device due to excessive pressure. Ultrasonic energy may be applied to the contact bumps on the interconnect through a transducer (not illustrated) mounted on the probe card. The ultrasonic motion will break through any contamination on the test pads insuring good electrical contact.

Figure 6:
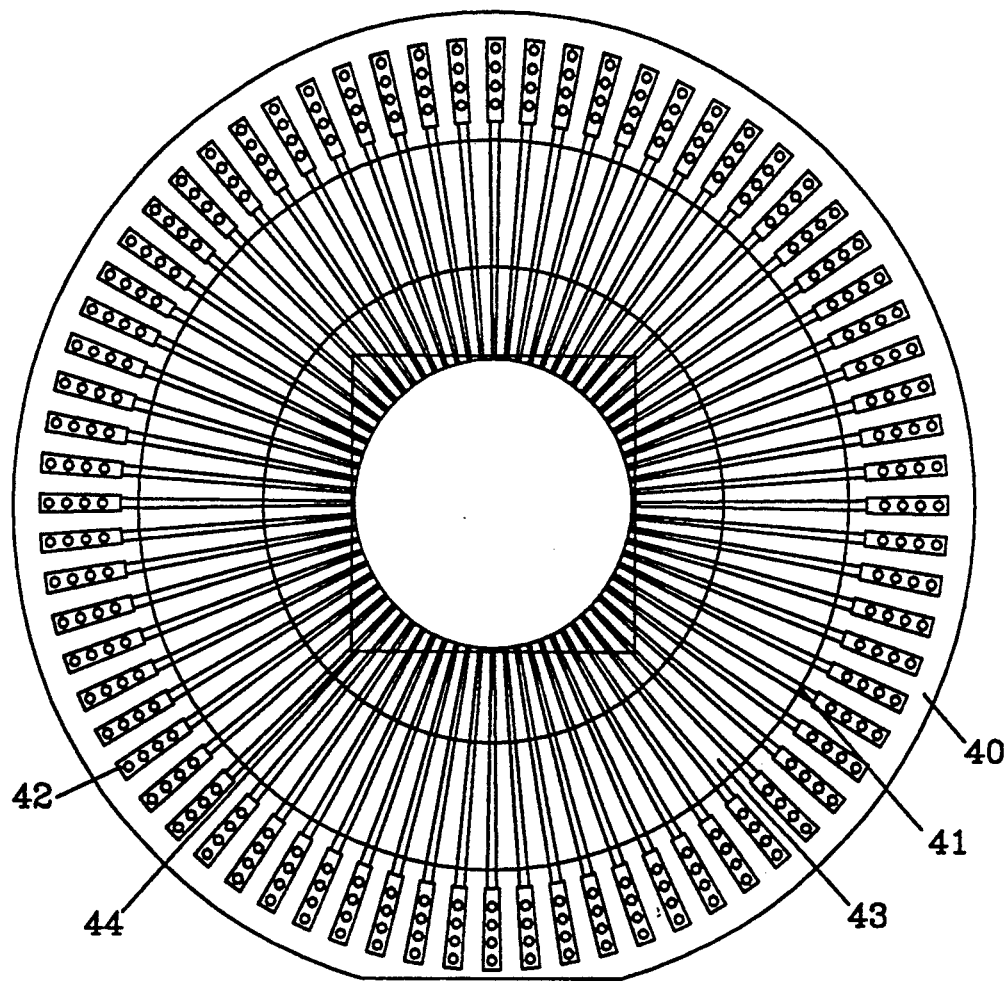
FIGS. 6 illustrates generic probe card interconnections.

FIG. 6 is a generic design for a probe card. The polyimide layer(s) 40 has an array of signal leads 41 extending from the central portion of the polyimide membrane 40 to the edge of the membrane where each signal lead has a wire bond pad 42. In FIG. 6, the signal leads are not shown attached to probe bumps since FIG. 6 is used to illustrate a generic probe card configured to a standard probe head/automated test equipment, which may be adapted to various devices, by customizing bump patterns of membrane probe heads.

Figure 7:
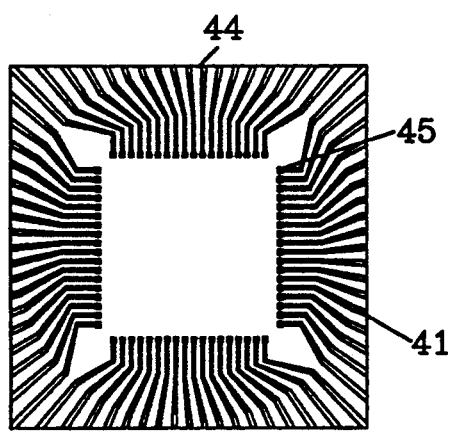
FIGS. 7 and 8 illustrate two different configurations of interconnects.

FIG. 7 illustrates the central portion of a probe card that has a high density array of signal leads 44 attached to probe bumps 45 configured to probe an ASIC device.

Figure 8:
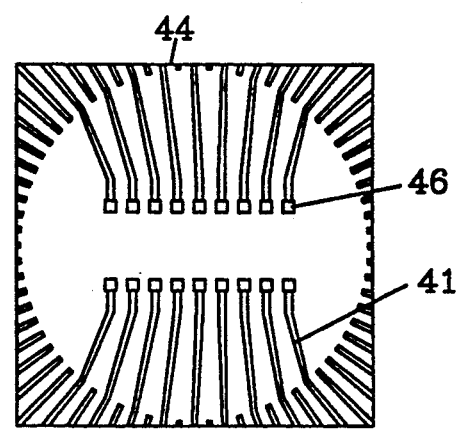

FIG. 8 illustrates the central portion of a probe card that has signal leads 41 attached to probe bumps configured for a single die with signal pads on two sides of the die only.

The probe card contact configurations in FIGS. 7 and 8 are used by way of example to show that the probe card can be configured to probe and test essentially any type of semiconductor device. The probe head signal leads and probe bumps are patterned and deposited using standard semiconductor processing techniques. Therefore, the probe head can be customized easily and cheaply to test new integrated circuit devices as they are developed.

FIG. 9 illustrates a probe card that may be used to test multiple devices on the semiconductor wafer on which they are formed. This configuration may also be used to probe two or more different DUTs which are uniformly spaced, close together (i.e. 20 mil streets), with bond pads in the same plane, on a single unifying substrate, such as the first step in assembling a multichip module. FIG. 9 shows signal leads 50 and probe bumps 51 configured to test eight semiconductor devices simultaneously. It is to be under stood that the signal leads 50 need not be formed on a single layer of polyimide, but may be in several layers to assure isolation of the signal lead. Ground planes and matched impedance lines may be formed in the multiple layers forming the membrane to provide low-loss signal lines for high frequency testing. As in the test probes described above, the membrane is supported by a backing plate similar to the construction described with reference to FIGS. 1-5.

FIG. 10a is an enlarged portion of FIG. 9 illustrating one possible configuration for probe bumps 51. FIG. 10B is an enlargement of two test contact areas taken from FIG. 10a.

Alignment for the probe card may be automated by video equipment viewing the device by a camera, and the position aligned through computer/software/hardware interfaces.

Figure 11:
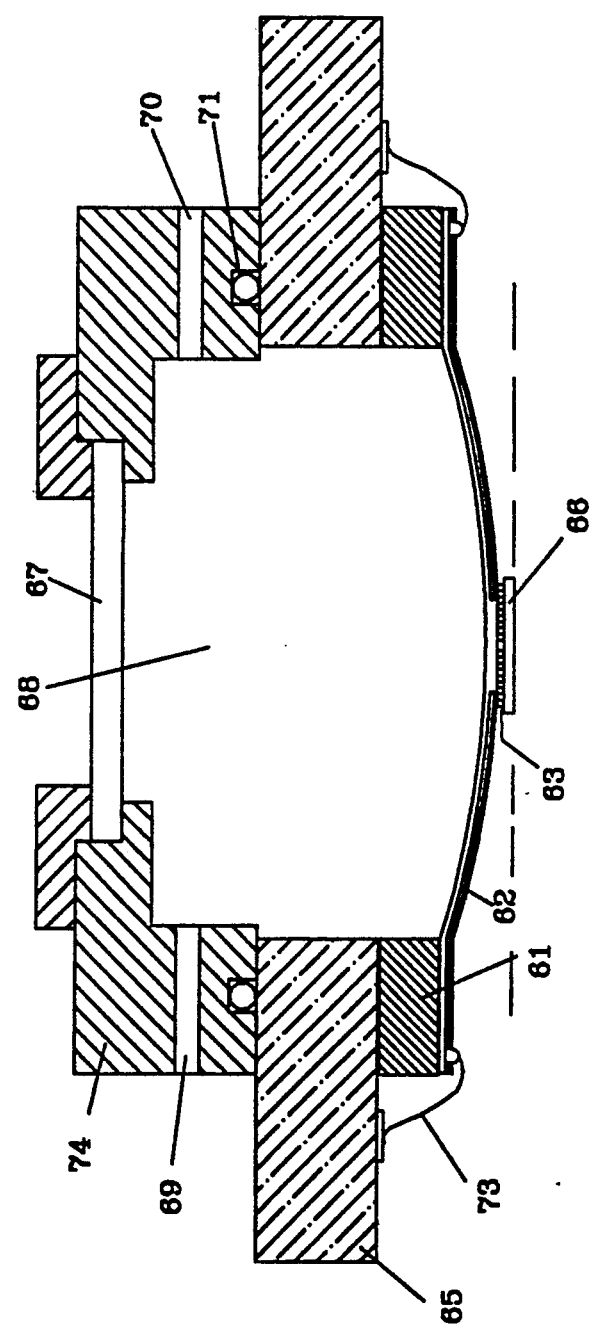
FIG. 11 illustrates the membrane probe head assembled in a pneumatic system for testing devices.

FIG. 11 illustrates part of a fixture that may be used in testing a semiconductor device 66. Each contact bump 63 corresponds to a test point or I/O contact pad of device 66. Contact bumps 63 are connected to signal leads 62 in membrane 60. Connection is made between the signal leads 62 and interface circuit board 65 by bond wires 73. A pressure chamber 68 is attached to a printed circuit board 65. O-rings 71 form a seal between the circuit board 65 and pressure chamber base 74. To test a device, the fixture is aligned over device 66 by inspecting the position contact bumps 63 through alignment window 67. When device 66 is aligned, air is admitted through inlet 69 and the air inside the pressure chamber is raised to a predetermined pressure as determined by pressure gage 70. By increasing the pressure in chamber 68, the membrane is moved outwardly to bring contact bumps into contact with the bond pads on device 66. After tests are complete, pressure is decreased in pressure chamber 68, moving contact bumps out of contact with semiconductor device 66. Vacuum is used to pull the membrane fully clear of the surface. Depth of focus of microscope should still allow for alignment to pads on DUT.

What is claimed:

1. A method for constructing a probe card for interfacing and testing unmounted semiconductor die, comprising the steps of:
   forming a flexible insulating film on a first side of a substrate;
   depositing a pattern of metal signal leads on the coated side of the substrate;
   forming a layer of flexible insulating film over the metal signal leads;
   forming connection vias in the insulating film over the metal signal leads;

forming contact pads on and through the vias to make contact pads connected to the signal leads; and etching the substrate from a second side to remove a central part of the substrate; such that the film and signal leads are supported by the remaining periphery of the substrate.

2. The method according to claim 1, wherein the insulating film is formed from a liquid polyamic acid resin, selected to provide a polyimide film having a CTE of 3 to 5.

3. The method according to claim 1, wherein the vias are formed using photolithographic techniques.

4. The method according to claim 1, including the step of mounting the probe card on a printed circuit board for interfacing with a test system.

5. The method according to claim 1, including forming contact bumps connected to an end of each metal signal lead to interface with the semiconductor die.

6. The method according to claim 5, including the step of placing an insert plate adjacent to the contact bumps to maintain the contact bumps in a common plane.

7. The method according to claim 1, including the step of backing the flexible film with a elastomer polymer.

8. The method according to claim 7, including a backing plate to hold the elastomer polymer against the flexible film.

9. A method for constructing a probe card for interfacing and testing unmounted semiconductor die, comprising the steps of:

forming a polyimide film on a first side of an aluminum wafer;

depositing a pattern of signal leads on the coated side of the metal wafer;

forming a second layer of polyimide film over the signal leads;

opening vias in the polyimide film over the signal leads;

forming contact pads on and through the vias to make contact pads connected to the signal leads;

forming contact bumps on a central portion of the polyimide film;

etching the wafer from a second side to form an aluminum ring exposing the central portion of the polyimide film through the ring;

placing an insert plate through the aluminum ring and adjacent the central portion of the polyimide film;

placing an elastomer in the central portion of the aluminum ring; and placing a backing plate against the metal ring to hold the elastomer in place.

10. The method according to claim 9, including the step of mounting the probe card on a printed circuit board to interface with a test system.

* * * * *